United States Patent [19]

Asano

[11] Patent Number: 5,298,445

[45] Date of Patent: Mar. 29, 1994

[54] METHOD FOR FABRICATING A FIELD EFFECT TRANSISTOR

[75] Inventor: Kazunori Asano, Tokyo, Japan

[73] Assignee: NEC Corporation, Japan

[21] Appl. No.: 65,622

[22] Filed: May 21, 1993

[30] Foreign Application Priority Data

May 22, 1992 [JP] Japan .................................. 4-130918

[51] Int. Cl.[5] .................................. H01L 21/265
[52] U.S. Cl. .................................. 437/40; 437/133; 437/184; 437/912; 148/DIG. 53; 148/DIG. 106; 148/DIG. 110
[58] Field of Search .................. 437/40, 41, 912, 107, 437/176, 177, 133, 126; 148/DIG. 53, DIG. 110

[56] References Cited

U.S. PATENT DOCUMENTS

| | | | |
|---|---|---|---|
| 4,632,710 | 12/1986 | Van Rees | 437/107 |
| 4,711,858 | 12/1987 | Harder et al. | 437/176 |
| 4,977,100 | 12/1990 | Shimura | 437/912 |
| 5,182,218 | 1/1993 | Fujihira | 437/41 |
| 5,196,359 | 3/1993 | Shih et al. | 437/107 |

FOREIGN PATENT DOCUMENTS

| | | | |
|---|---|---|---|
| 61-161770 | 7/1986 | Japan | 437/912 |
| 63-281473 | 11/1988 | Japan | 437/40 |
| 2-105425 | 4/1990 | Japan | 437/133 |
| 2-113539 | 4/1990 | Japan | 437/912 |
| 2-150038 | 6/1990 | Japan | 437/40 |
| 2-252873 | 8/1992 | United Kingdom | 437/912 |

OTHER PUBLICATIONS

Sonoda et al; "High-Efficiency and Highly Reliable 20W GaAs Power Field Effect Transistor in C Band"; Jpn. J. Appl. Phys. vol. 31 (8) part 1, Aug. 1992, pp. 2374–2381.

Macksey, "GaAs Power FET's Having the Gate recess Narrower than the Gate", IEEE Electron Letter, vol. EDL 7, No. 2, Feb. 1986, pp. 69–70.

Primary Examiner—Brian E. Hearn
Assistant Examiner—Michael Trinh
Attorney, Agent, or Firm—Laff, Whitesel, Conte & Saret

[57] ABSTRACT

In a method for fabricating a FET of the present invention, first and second side walls are formed on a side surface of a gate electrode, and two n-GaAs layers are formed on an active layer by selective growth using the side walls as a mask. After that, the side walls are removed, whereby double recesses are formed around the gate electrode.

2 Claims, 3 Drawing Sheets

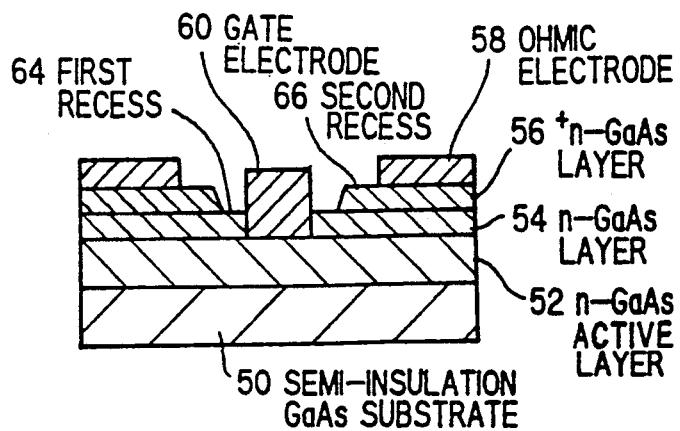
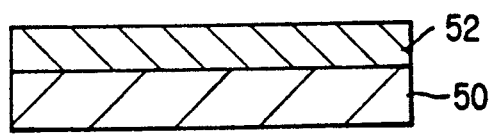
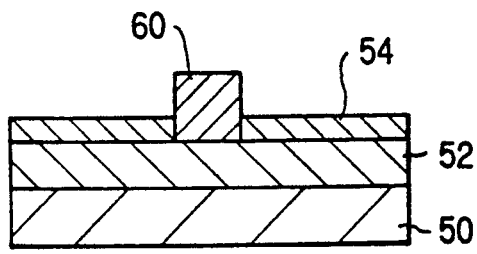
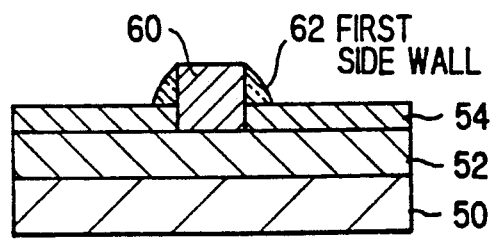
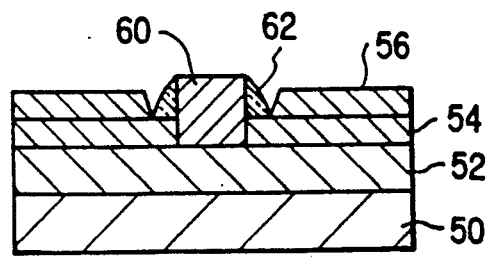

METHOD FOR FABRICATING A FIELD EFFECT TRANSISTOR

FIELD OF THE INVENTION

This invention relates to a method for fabricating a FET (field effect transistor), and more particularly, to a method for fabricating an FET of Schottkey gate type having a GaAs active layer.

BACKGROUND OF THE INVENTION

A GaAs-Schottkey gate type FET (MES-FET) is used as a high-power and high-frequency device or a low noise device in a microwave communication system. For a high power device, a MES-FET which is fabricated to have a recess structure, that is a portion surrounding a gate electrode which is recessed, has been proposed. In such a MES-FET of the recess structure type, it is known that a double recess structure having two recesses is especially useful or height output property.

A conventional MES-FET includes a semi-insulation GaAs substrate, an n-GaAs active layer, an ohmic electrode, an insulation layer and a gate electrode.

In fabrication, the n-GaAs function layer is formed on the semi-insulation substrate, and the ohmic electrode for a source/drain electrode is formed on the n-GaAs active layer. After that, the insulation layer is entirely formed on the substrate thus processed.

Then, a photoresist layer is formed on the insulation layer, and the insulation layer is etched to form a gate hole thereon by using the photoresist layer as a mask.

Then, the n-GaAs active layer is etched to form a first recess thereon by etching, and the insulation layer is etched on the side surface. After that, the n-GaAs active layer is etched to form a second recess.

Finally, gate metal is evaporated and lifted off to form the gate electrode, whereby the GaAs MES-FET is completely fabricated.

In the GaAs MES-FET fabricated by the conventional method, however, there are disadvantages in that the depth of the recesses is difficult to be stably constant as specified, because the recesses are formed by etching. Therefore, drain current tends to vary in wide range.

Further, a drain current or a break-down voltage for a gate is fluctuated, because the surface for the gate metal deposition is fluctuated at a pre-treatment stage, and the evaporation or sputtering process for the gate metal deposition is unstable. Still further, the control for precisely determining the side-etch amount of the insulation film to provide a predetermined size of the second recess is also difficult to be carried out. For these reasons, a GaAs MES-FET having a high performance is not fabricated with high yield.

SUMMARY OF THE INVENTION

Accordingly, it is an object of the invention to provide a method for fabricating a FET by which double recesses can be formed with high precision in It is a further object of the invention to provide a method for fabricating a FET, by which an FET having double recesses is fabricated with high yield.

It is a still further object of the invention to provide a method for fabricating a FET, in which the control for precisely determining the size of the double recesses becomes easy.

According to the invention, a method for fabricating a FET (field effect transistor), includes the steps of:

providing a semiconductor substrate on which a semiconductor active layer is formed;

forming a gate electrode on the semiconductor active layer;

forming a first side wall on a side surface of the gate electrode;

forming a first semiconductor layer on the semiconductor active layer by selective growth using the gate electrode and the first side wall as a mask;

forming a second side wall on a side surface of the gate electrode covered with the first side wall;

forming a second semiconductor layer on the first semiconductor layer by selective growth using the gate electrode and the first and second side walls as a mask; and forming an ohmic electrode on the second semiconductor layer.

The other objects and features of the invention will become understood from the following description with reference to the accompanying drawings.

BRIEF DESCRIPTION OF THE DRAWINGS

FIG. 5 is a cross-sectional view showing an MES-FET fabricated by a method of a second preferred embodiment according to the invention; and FIGS. 6A to 6D are cross-sectional views showing fabrication process of the second preferred embodiment.

DESCRIPTION OF THE PREFERRED EMBODIMENTS

For better understanding the background of the present invention, the basic principle of the technology is first described hereinafter by reference to FIG. 1 and FIGS. 2A to 2D.

Figure 1:
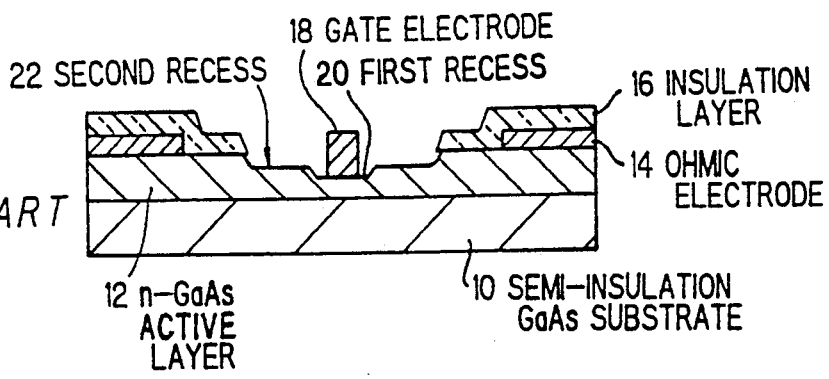
FIG. 1 is a cross-sectional view showing an MES-FET fabricated by a conventional method.

FIG. 1 shows a GaAs MES-FET fabricated by a conventional method. The GaAs MES-FET includes a semi-insulation GaAs substrate 10, an n-GaAs active layer 12, an ohmic electrode 14, an insulation layer 16 and a gate electrode 18. The n-GaAs active layer 12 is structured to have first and second recesses 20 and 22 surrounding the gate electrode 18.

Figure 2A:
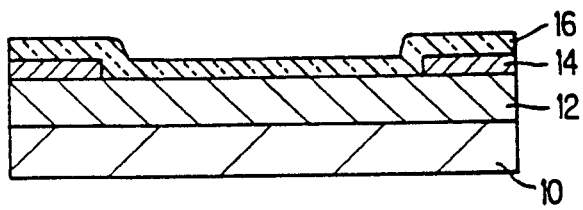
FIGS. 2A to 2D are cross-sectional views showing fabrication process of the conventional method.

In fabrication, the n-GaAs function layer 12 is formed on the semi-insulation substrate 10, and the ohmic electrode 14 for a source/drain electrode is formed on the n-GaAs operation layer 12. After that, the insulation layer 16 is entirely formed on the substrate thus processed as shown in FIG. 2A.

Figure 2B:
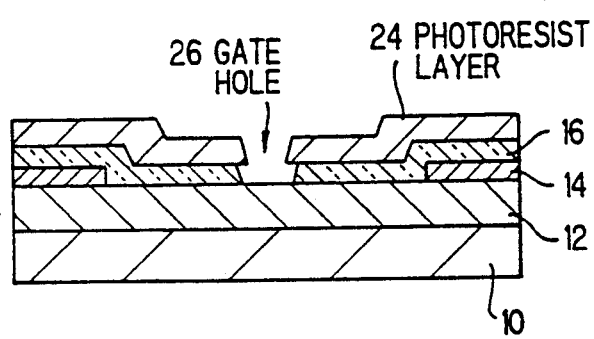

Then, a photoresist layer 24 is formed on the insulation layer 16, and the insulation layer 16 is etched to form a gate hole 26 thereon by wet etching or reactive ion etching using the photoresist layer 24 as a mask, as shown in FIG. 2B.

Figure 2C:
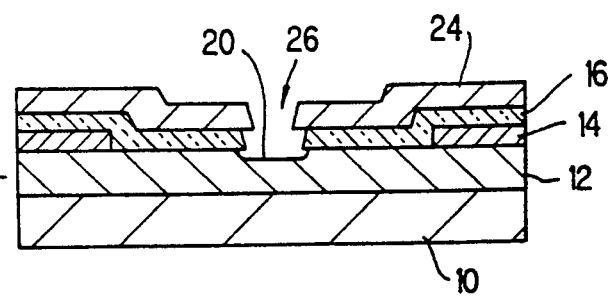

Then, the n-GaAs active layer 12 is etched to form the first recess 20 thereon by wet etching as shown in FIG. 2C.

Figure 2D:
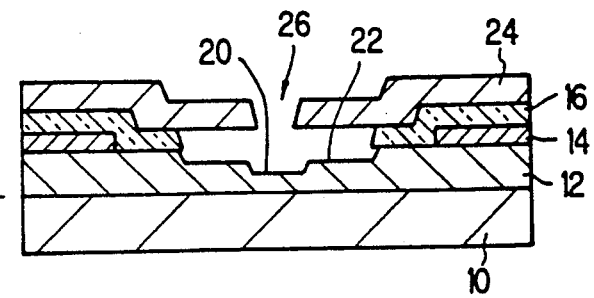

Then, the insulation layer 16 is etched on the side surface by wet etching using hydrofluoric acid. After that, the n-GaAs active layer 12 is etched to form the second recess 22 by wet etching using the same solution of the prior process, as shown in FIG 2D.

Finally, a gate metal is evaporated and lifted off to form the gate electrode 18, whereby the GaAs MES-FET is completely fabricated as shown in FIG. 1.

In the GaAs MES-FET, the amount of a drain current is adjusted by the depth of the recesses 20 and 22, that is, an unetched thickness of the n-GaAs active layer 12. A break-down voltage of the gate electrode 18 is affected by a distance between the gate electrode 18 and each inside edge of the recesses 20 and 22. Further, the high frequency performance of the transistor is affected by the fluctuation of the break-down voltage.

In each a GaAs MES-FET having double recesses which is fabricated by the method as described above, the influence of a surface deletion layer around a gate electrode is decreased by the provision of the first recess, and a parasitic resistance is also decreased. Further, a sufficient break-down voltage for the gate electrode is possible to be obtained by atomizing a width of the second recess. For these reasons, the GaAs MES-FET provides a high efficiency and represents an excellent property as a high output FET. However, this conventional GaAs MES-FET has disadvantages as described before.

Figure 3:
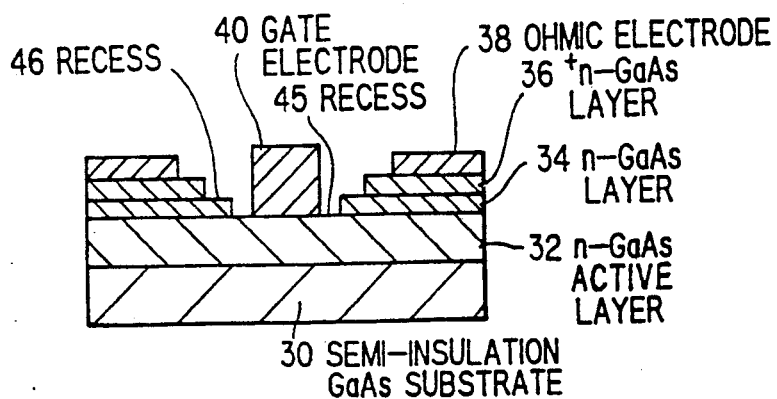
FIG. 3 is a cross-sectional view showing an MES-FET fabricated by a method of a first preferred embodiment according to the invention.

FIG. 3 shows a GaAs MES-FET fabricated by a method of a first preferred embodiment according to the invention. The GaAs MES-FET includes a semi-insulation GaAs substrate 30, an n-GaAs function layer 32, an n-GaAs layer 34, an n+-GaAs layer 36, an ohmic electrode 38 and a gate electrode 40.

Figure 4A:
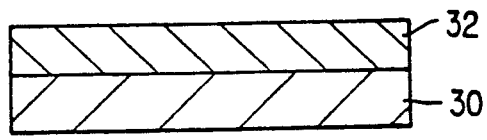
FIGS. 4A to 4D are cross-sectional views showing fabrication process of the first preferred embodiment.

In fabrication, the n-GaAs active layer 32 is formed on the semi-insulation substrate 30 to have an impurity concentration of $2 \times 10^{17}$ cm$^{-3}$ and a depth of 0.3 $\mu$m by MBE (molecular beam epitaxy) method, as shown in FIG. 4A. The n-GaAs active layer 32 may be formed by ion implantation method using Is ion with implantation energy of 100 KeV and dose of $4 \times 10^{12}$ cm$^{-2}$.

Figure 4B:
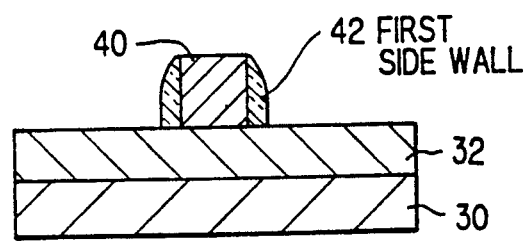

Then, WSi (Tungsten-silicide) for the gate electrode 40 is sputtered on the n-GaAs active layer 32 to have a thickness of 3000 to 4000 Å, and the WSi layer is shaped in vertical direction by reactive ion etching under the condition of mixed gas of CF$_4$ and CF$_6$, pressure of 5 to 1 mToor and power of 150 to 600 W, using a photoresist having a thickness of 1 $\mu$m ("TSMR-8900" by "Tokyo Application Chemistry Corporation") as a mask. After that, an insulation layer such as of SiO$_2$ is dumped to have a thickness of 2000 Å on the whole surface of the substrate thus processed. The thickness of the insulation should be determined as precisely specified, because a distance between the gate electrode 40 and the edge of the recess is defined based on the thickness of the insulation layer. And, a first side wall 42 is then formed on the side surface of the gate electrode 40 by anisotropy dry etching, as shown in FIG. 4B.

Figure 4C:
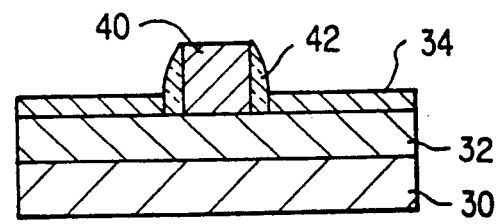

Then, the n-GaAs layer 34 is selectively grown by a vapor growth method such as MOCVD (Metal Organic CVD) method, as shown in FIG. 4C. This process is carried out under the condition that mixed gas of TMG (trimethylgallium) and AsH$_3$ (arsine) is used with Is$_2$H$_6$ as dopant under the growth temperature of 500° to 600° C.

In the same manner as the case of the first side wall 42, a second side wall 44 is formed on the surface of the gate electrode 40 covered with the first side wall 42.

Figure 4D:
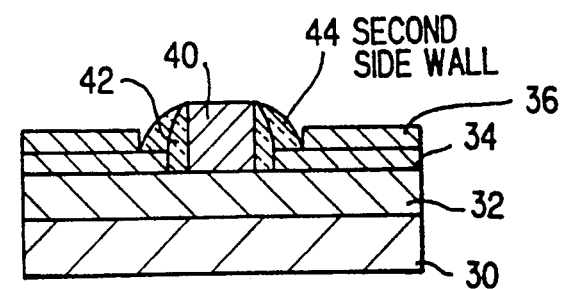

After that, the n+-GaAs layer 36 is formed on the n-GaAs layer 34 by vapor growth using the first and second side walls 42 and 44 as a mask, as shown in FIG. 4D. The n+-GaAs layer 36 is to be a contact layer.

Then, the first and second side walls 42 and 44 are removed by etching using hydrofluoric acid. Finally, ohmic metal is evaporated on the n+-GaAs layer 36 and alloyed whereby the ohmic electrode 38 is formed as shown in FIG. 3. As a result, two recesses 45 and 46 are formed around the gate electrode 40 by self alignment.

As apparent from the above explanation, a distance between the gate electrode and each of the recess edges can be controlled with high precision in accordance with the thickness of the side walls in the first preferred embodiment, so that the control property of a gate electrode break-down voltage is obtained with extremely high precision. In this case, the control property of a drain current is not deteriorated at all. In connection with the uniformity of drain currents, for instance, the fluctuation of a drain current flowing in a wafer of 3 inches is approximately 10 mA in the GaAs MES-FET fabricated by the conventional method having the recess-etching step, while the drain current fluctuation is decreased as small as less than 4 mA in the GaAs MES-FET fabricated by the method in the first preferred embodiment. In connection with the dimension between the gate electrode and the recess, the fluctuation of more than 0.1 $\mu$m is observed in the conventionally fabricated GaAs MES-FET, while it is suppressed less than 0.02 $++$m in the first preferred embodiment. Consequently, the fluctuation of a gate electrode break-down voltage can be negligible in the invention.

FIG. 5 shows a GaAs MES-FET fabricated by a method of a second preferred embodiment according to the invention. The GaAs MES-FET includes a semi-insulation GaAs substrate 50, an n-GaAs active layer 52, an n-GaAs layer 54, an n+-GaAs layer 56, an ohmic electrode 58 and a gate electrode 60.

In fabrication, the n-GaAs function layer 52 is formed on the semi-insulation substrate 50 to have impurity concentration of $2 \times 10^{17}$ cm$^{-3}$ and a depth of 0.3 $\mu$m by MBE (molecular beam epitaxy) method, as shown in FIG. 6A. The n-GaAs function layer 52 may be formed by ion implantation method using Is ion with implantation energy of 100 KeV and dose of $4 \times 10^{12}$ cm$^{-2}$.

Then, WSi (Tungsten-silicide) for the gate electrode 60 is sputtered on the n-GaAs function layer 52 to have a thickness of 3000 to 4000 Å, and the WSi layer is shaped in vertical direction by reactive ion etching using a photoresist layer (not shown) as a mask. After that, the n-GaAs layer 54 is selectively grown on the n-GaAs active layer 52 by a vapor growth method such as MOCVD (Metal Organic CVD) method using the gate electrode 60 as a mask, as shown in FIG. 6B.

Then, a insulation layer (not shown) is formed on the whole surface of the substrate thus processed, and a first side wall 62 is formed on the side surface of the gate electrode 60 by reactive dry etching, as shown in FIG. 6C.

Then, the n+-GaAs layer 56 which will be a contact layer is formed on the n-GaAs layer 54 by vapor growth using the first side wall 52 as a mask, as shown in FIG. 6D.

After that, the first side wall 62 is removed by etching, whereby a first recess 64 is formed around the gate electrode 60. Finally, ohmic metal is evaporated on the n+-GaAs layer 56 and is alloyed whereby the ohmic electrode 58 is formed as shown in FIG. 5. At this time, the ohmic metal is not evaporated around the gate electrode 60 whereby a second recess 64 is formed there.

According to the second preferred embodiment, there is an advantage, in addition to the advantages of the first preferred embodiment described before, in that a surface condition around the gate electrode 60 is stable, because the gate electrode 60 is buried at the bottom in the channel, that is, the n-GaAs layer 54.

In the second preferred embodiment, an undoped GaAs layer or an un-doped AlGaAs layer may be selectively grown on the n-GaAs operation layer 52 instead of the n-GaAs layer 54. The AlGaAs layer is grown by MOCVD (Metal Organic CVD) method in the condition that TMAl (trimethylaluminium) is added in mixed gas of TMG (trimethylgallium) and AsH$_3$ (arsine). In these cases, surface affection to the n-GaAs operation layer 52 can be reduced by the un-doped layer, so that high frequency characteristics of the transistor is specifically stable.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching herein set forth.

What is claimed is

1. A method for fabricating a FET (field effect transistor), comprising the steps of:
   providing a semiconductor substrate on which a semiconductor active layer is formed;
   forming a gate electrode on said semiconductor active layer;
   forming a first side wall on a side surface of said gate electrode;
   forming a first semiconductor layer on said semiconductor active layer by selective growth using said gate electrode and said first side wall as a mask;
   forming a second side wall on a side surface of said gate electrode covered with said first side wall;
   forming a second semiconductor layer on said first semiconductor layer by selective growth using said gate electrode and said first and second side walls as a mask;
   removing said first and second side walls from said side surface of said gate electrode to provide a recess structure; and
   forming an ohmic electrode on said second semiconductor layer.

2. A method for fabricating a FET (field effect transistor), according to claim 1, wherein:
   said semiconductor substrate is of semi-insulation GaAs;
   said semiconductor active layer is of n-GaAs;
   said first semiconductor layer is of n-GaAs; and
   said second semiconductor layer is of n$^+$-GaAs.

* * * * *